(12) United States Patent
Chun et al.

(10) Patent No.: US 9,887,286 B2
(45) Date of Patent: Feb. 6, 2018

(54) SEMICONDUCTOR DEVICE HAVING LOW IMPEDANCE AND METHOD OF MANUFACTURING THE SAME

(71) Applicant: HYUNDAI MOTOR COMPANY, Seoul (KR)

(72) Inventors: Dae Hwan Chun, Gwangmyeong-si (KR); Jong Seok Lee, Suwon-si (KR); Junghee Park, Suwon-si (KR); Kyoung-Kook Hong, Hwaseong-si (KR); Youngkyun Jung, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 102 days.

(21) Appl. No.: 14/853,459

(22) Filed: Sep. 14, 2015

(65) Prior Publication Data
US 2016/0172483 A1 Jun. 16, 2016

(30) Foreign Application Priority Data
Dec. 12, 2014 (KR) ........................ 10-2014-0179659

(51) Int. Cl.
*H01L 29/78* (2006.01)
*H01L 29/66* (2006.01)
(Continued)

(52) U.S. Cl.
CPC .... *H01L 29/7813* (2013.01); *H01L 29/66068* (2013.01); *H01L 29/66719* (2013.01); *H01L 29/1608* (2013.01)

(58) Field of Classification Search
CPC ........... H01L 29/7813; H01L 29/66068; H01L 29/66719
(Continued)

(56) References Cited

U.S. PATENT DOCUMENTS 5,488,236 A * 1/1996 Baliga ................ H01L 29/1095
257/132
5,742,076 A * 4/1998 Sridevan ............... H01L 21/049
257/289
(Continued)

FOREIGN PATENT DOCUMENTS

JP 2008-536316 A 9/2008
JP 2010-258386 A 11/2010
(Continued)

*Primary Examiner* — Joseph C Nicely
*Assistant Examiner* — Thai T Vuong
(74) *Attorney, Agent, or Firm* — McDermott Will & Emery LLP

(57) ABSTRACT

The present inventive concept relates to a semiconductor device, and more particularly to a semiconductor device that can increase the amount of current by reducing impedance, and a method of manufacturing the semiconductor device. A semiconductor device comprises an n− type epitaxial layer disposed on a first surface of an n+ type silicon carbide substrate; an n+ region disposed on the n− type epitaxial layer; first and second trenches disposed in the n− type epitaxial layer and the n+ region; first and second gate insulating layers disposed inside the first and second trenches, respectively; first and second gate electrodes disposed on the first and second gate insulating layers, respectively; a p-type region disposed on two sides of one of the first and second trenches; an oxidation film disposed on the first and second gate electrodes; a source electrode disposed on the n+ region and the oxidation film; and a drain electrode disposed on a second surface of the n+ type silicon carbide substrate, wherein a first channel is disposed on two sides of the first trench and a second channel is disposed on two sides of the second trench.

5 Claims, 13 Drawing Sheets

(51) Int. Cl.
*H01L 29/10* (2006.01)
*H01L 29/16* (2006.01)

(58) Field of Classification Search
USPC .......................................................... 257/331
See application file for complete search history.

(56) References Cited

U.S. PATENT DOCUMENTS

| | | | |
|---|---|---|---|
| 6,445,037 B1 * | 9/2002 | Hshieh | H01L 29/0847 257/329 |
| 7,928,505 B2 * | 4/2011 | Hirao | H01L 29/407 257/330 |
| 2012/0061753 A1 * | 3/2012 | Nishiwaki | H01L 29/407 257/331 |
| 2013/0001681 A1 * | 1/2013 | Sin | H01L 29/4236 257/330 |
| 2013/0313568 A1 * | 11/2013 | Hayashi | H01L 21/28008 257/77 |
| 2014/0015036 A1 | 1/2014 | Fursin et al. | |

FOREIGN PATENT DOCUMENTS

| | | |
|---|---|---|
| JP | 2012-178536 A | 9/2012 |
| KR | 10-0510096 B1 | 2/2006 |
| KR | 2014-0044075 A | 4/2014 |

* cited by examiner

| Item | Structure A (510) | Structure B (520) | Invention (530) |
|---|---|---|---|
| Breakdown voltage(V) | 958 | 956 | 959 |
| Impedance(mΩ/cm²) | 4.974 | 4.195 | 3.305 |
| Current density(A/cm²) | 302 | 360 | 454 |
| Performance index(MW/cm²) | 185 | 218 | 278 |

SEMICONDUCTOR DEVICE HAVING LOW IMPEDANCE AND METHOD OF MANUFACTURING THE SAME

CROSS-REFERENCE TO RELATED APPLICATION

This application claims the benefit of priority to Korean Patent Application No. 10-2014-0179659, filed in the Korean Intellectual Property Office on Dec. 12, 2014, the entire content of which is incorporated herein by reference.

TECHNICAL FIELD

The present disclosure relates to a semiconductor device, and more particularly, to a semiconductor device that can increase an amount of current by reducing impedance, and a method of manufacturing the semiconductor device.

BACKGROUND

Recently, as application devices have increased in size and capacity, the demand for a power semiconductor device having a high breakdown voltage, a high current, and a high-speed switching characteristic has been on the rise.

The power semiconductor device requires low impedance and a low saturation voltage in order to allow a large amount of current to flow and reduce a loss of power while electricity is transmitted. Further, the power semiconductor device should be capable of resisting a backward high voltage of a PN junction applied to both ends of the power semiconductor device in an off-state or when a switch is turned off. That is, the power semiconductor device basically requires a high breakdown voltage.

In power semiconductor devices, a MOSFET (Metal Oxide Semiconductor Field Effect Transistor) is the most typical field effect transistor in digital circuits and analog circuits.

When a power semiconductor device is manufactured, the required concentration and the thickness of an epitaxial region or a drift region of a raw material to be used depends on the rated voltage of the semiconductor device. In order to obtain concentration and thickness of a raw material required under a breakdown voltage theory and an appropriate breakdown voltage at a desired level, it is required to minimize an increase in a surface electric field at an interface of a semiconductor and a dielectric material by appropriately producing an electric field induced by a depletion layer in a reverse bias mode of a PN junction, appropriately using a PN junction structure, and to design a power semiconductor device to sufficiently resist even an inherent threshold electric field of the raw material in terms of breakdown of the power semiconductor device.

In particular, the state of a SiC interface and a silicon oxide film functioning as a gate insulation film in a MOSFET using a silicon carbide (SiC) is poor, and it influences flow of an electric current flowing through a channel created at sides of the silicon oxide film, so mobility of electrons is greatly decreased.

Further, the MOSFET of the related art enters a floating state in which an electrical signal cannot be directly supplied to a base region.

The Description of the Related Art is made to help understanding the background of the present disclosure, and may include matters out of the related art known to those skilled in the art.

The above information disclosed in this Background section is only for enhancement of understanding of the background of the inventive concept and therefore it may contain information that does not form the prior art that is already known in this country to a person of ordinary skill in the art.

SUMMARY

The present disclosure has been made in an effort to provide a semiconductor device having features including both an inversion layer channel and an accumulation layer channel, and a method of manufacturing the semiconductor device.

Further, the present disclosure provides a semiconductor device of which the source electrode can come in contact with an n+ region and a p-type region, and a method of manufacturing the semiconductor device.

An exemplary embodiment of the present inventive concept provides a semiconductor device comprising an n− type epitaxial layer disposed on a first surface of an n+ type silicon carbide substrate; an n+ region disposed on the n− type epitaxial layer; first and second trenches disposed in the n− type epitaxial layer and the n+ region; first and second gate insulating layers disposed inside the first and second trenches, respectively; first and second gate electrodes disposed on the first and second gate insulating layers, respectively; a p-type region disposed on two sides of one of the first and second trenches; an oxidation film disposed on the first and second gate electrodes; a source electrode disposed on the n+ region and the oxidation film; and a drain electrode disposed on a second surface of the n+ type silicon carbide substrate, wherein a first channel is disposed on two sides of the first trench and a second channel is disposed on two sides of the second trench.

The source electrode may be in contact with the n+ region and the p-type region.

The bottom surface of the source electrode may be alternately in contact with a top surface of the n+ region and a top surface of the p-type region.

The p-type region may be disposed on two sides of the second trench, and the first channel may be an accumulation-layer channel and the second channel may be an inversion-layer channel.

The first and second trenches may have different depths.

The first and second gate insulating layers may have different thicknesses.

The first and second gate electrodes may have different depths.

Another exemplary embodiment of the present inventive concept provides a method of manufacturing a semiconductor device that includes forming an n− type epitaxial layer on a first surface of an n+ type silicon carbide substrate; forming an n+ region on the n− type epitaxial layer; forming first and second trenches through the n− type epitaxial layer and the n+ region; forming a p-type region at two sides of one of the first and second trenches; forming first and second gate insulating layers inside the first and second trenches, respectively; forming first and second gate electrodes on the first and second gate insulating layers, respectively; forming an oxidation film on the first and second gate electrodes; forming a source electrode on the oxidation film and the n+ region; and forming a drain electrode on a second surface of the n+ type silicon carbide substrate, wherein a first channel is disposed on two sides of the first trench and a second channel is disposed on two sides of the second trench.

The step of forming the p-type region may include forming the p-type region by injecting ions into both sides of one of the first and second trenches.

A first channel may be an accumulation-layer channel and the second channel may be an inversion-layer channel.

The step of forming the source electrode may include forming the source electrode on the oxidation film, the n+ region, and the p-type region.

The step of forming the source electrode may include forming the source electrode such that a bottom surface of the source electrode is alternately in contact with a top surface of the n+ region and a top surface of the p-type region.

The step of forming the first and second trenches may include etching the n− type of epitaxial layer and the n+ region to form the first trench; and etching the n− type of epitaxial layer and the n+ region to form the second trench, wherein the second trench is etched to a different depth from the first trench.

The step of forming the first and second gate insulating layers may include forming the first gate insulating layer to have a different depth from the depth of the second gate insulating layer.

The step of forming the first and second gate insulating layers may include forming a first insulating layer in the first and second trenches; etching the first insulating layer disposed in the first trench to form the first gate insulating layer; and etching the first insulating layer disposed in the second trench to form the second gate insulating layer, wherein the first gate insulating layer is thicker than the second gate insulating layer.

Another exemplary embodiment of the present inventive concept provides a method of manufacturing a semiconductor device that includes forming an n− type epitaxial layer on a first surface of an n+ type silicon carbide substrate; forming an n+ region on the n− type epitaxial layer; forming first and second trenches through the n− type of epitaxial layer and the n+ region; forming a p-type region by injecting ions into two sides of one of the first and second trenches; forming first and second gate insulating layers in the first and second trenches, respectively; forming first and second gate electrodes on the first and second gate insulating layers, respectively; forming an oxidation film on the first and second gate electrodes; forming a source electrode on the oxidation film, the n+ region, and the p-type region; and forming a drain electrode on a second surface of the n+ type silicon carbide substrate, wherein the source electrode is alternately in contact with the n+ region and the p-type region.

The step of forming the p-type region may include forming the p-type region at both sides of the second trench, forming a first channel at both sides of the first trench, and forming a second channel at both sides of the second trench, wherein the first channel is an accumulation-layer channel and the second channel is an inversion-layer channel.

According to the present inventive concept, since the semiconductor device includes both an inversion-layer channel and an accumulation-layer channel, it is possible to reduce impedance and increase the amount of a current.

Further, since the source electrode is in contact with the n+ region and the p-type of region, it is possible to overcome floating in which an electrical signal cannot be directly connected.

Further, effects that can be obtained or expected from exemplary embodiments of the present inventive concept are directly or suggestively described in the following detailed description. That is, various effects expected from exemplary embodiments of the present inventive concept will be described in the following detailed description.

DETAILED DESCRIPTION

The operation principle of a semiconductor device according an exemplary embodiment of the present inventive concept and a method of manufacturing the semiconductor device will be described hereafter in detail with reference to the accompanying drawings. However, the drawings to be described below and the following detailed description relate to one exemplary embodiment of various exemplary embodiments for effectively explaining the characteristics of the present inventive concept. Therefore, the present inventive concept should not be construed as being limited to the drawings and the following description.

Further, in the description of the present inventive concept, the detailed description of related well-known configurations and functions is not provided, when it is determined as unnecessarily making the scope of the present inventive concept unclear. Further, the terminologies to be described below are ones defined in consideration of their function in the present inventive concept and may be changed by the intention of a user or an operator, or a custom. Therefore, their definition should be made on the basis of the description of the present inventive concept.

Further, in the following exemplary embodiments, the terminologies are appropriately changed, combined, or divided so that those skilled in the art can clearly understand them, in order to efficiently explain the main technical characteristics of the present inventive concept, but the present inventive concept is not limited thereto.

Hereinafter, exemplary embodiments of the present inventive concept will be described in detail with reference to the accompanying drawings.

A semiconductor device according to an exemplary embodiment of the present inventive concept is described with reference to FIG. 1, FIG. 2A, and FIG. 2B.

Figure 1:
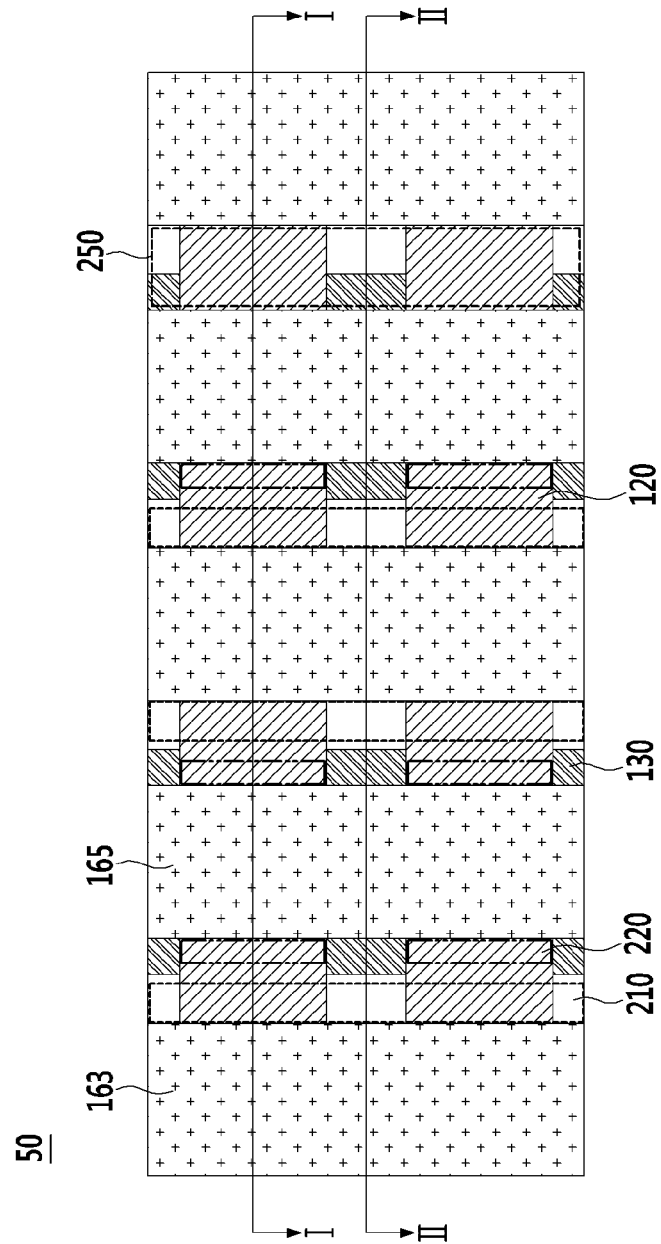
FIG. 1 is a top plan view showing a semiconductor device according to an exemplary embodiment of the present inventive concept.
Figure 2A:
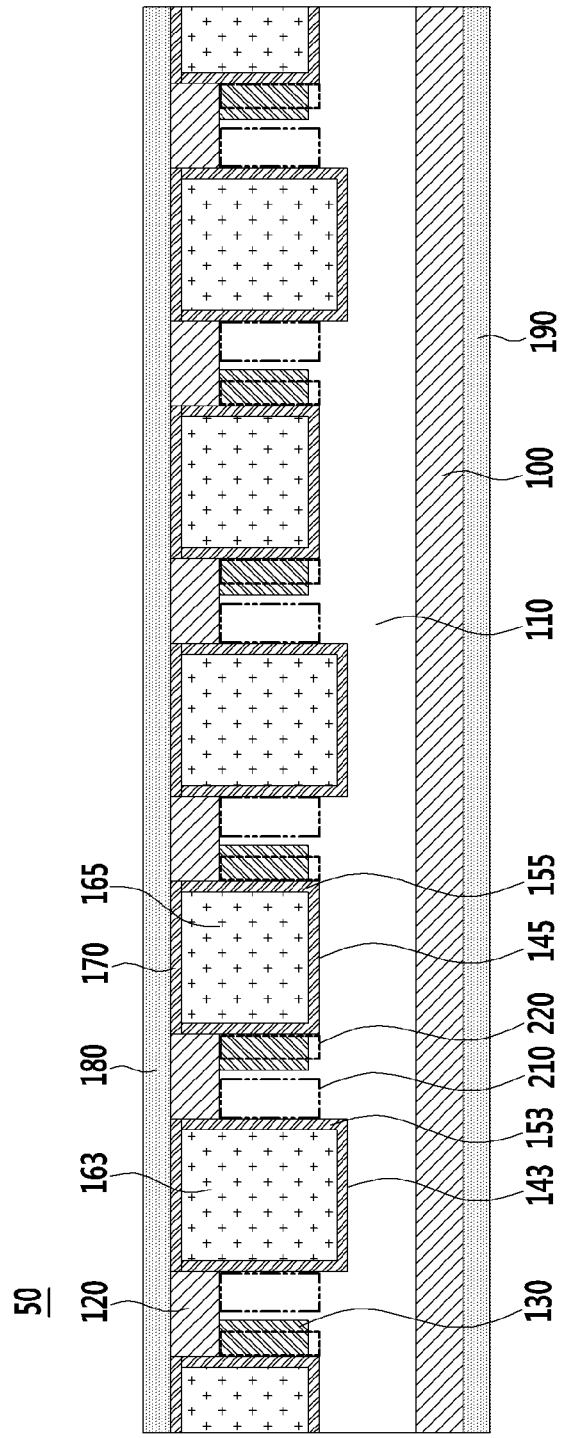
FIG. 2A is a cross-sectional view taken along line I-I in FIG. 1.
Figure 2B:
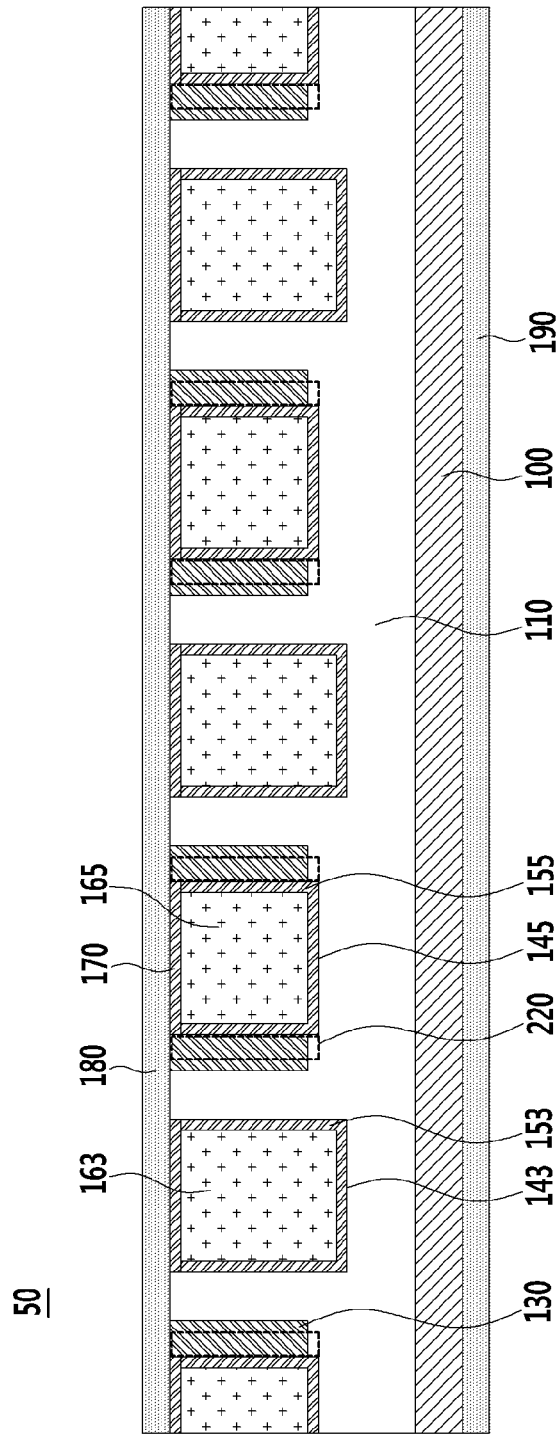
FIG. 2B is a cross-sectional view taken along line II-II in FIG. 1.

FIG. 1 is a top plan view showing a semiconductor device according to an exemplary embodiment of the present inventive concept, FIG. 2A is a cross-sectional view taken along line I-I in FIG. 1, and FIG. 2B is a cross-sectional view taken along line II-II in FIG. 1. FIG. 1 is a top plan view showing a semiconductor device without a source electrode.

Referring to FIGS. 1, 2A, and 2B, a semiconductor device 50 includes a n+ type silicon carbide substrate 100, an n− type epitaxial layer 110, an n+ region 120, a p-type region 130, a first trench 143, a second trench 145, a first gate insulating layer 153, a second gate insulating layer 155, a first gate electrode 163, a second gate electrode 165, an oxidation film 170, a source electrode 180, and a drain electrode 190.

The n− type epitaxial layer 110 is disposed on a first surface of the n+ type silicon carbide substrate 100.

The n+ region 120 is formed on the n− type epitaxial layer 110. The n+ region 120 may be composed of n+ ions such as phosphorus (P), arsenic (As), and antimony (Sb).

The first trench 143 and the second trench 145 are formed in the n− type epitaxial layer 110. That is, the first trench 143 and the second trench 145 are formed through the n− type epitaxial layer 110 and the n+ region 120.

The first gate insulating layer 153 is formed in the first trench 143. That is, the first gate insulating layer 153 is formed on inner sides of the first trench 143. The first gate electrode 163 is formed on the first gate insulating layer 153. In other words, the first gate electrode 163 fills a portion of the first trench 143 except for a portion where the first gate insulating layer 153 is formed.

The second gate insulating layer 155 and the second gate electrode 165 are formed in the second trench 145. That is, the second gate insulating layer 155 is formed around the inner sides of the second trench 145, and the second gate electrode 165 is formed on the second gate insulating layer 155, filling the second trench 145.

The p-type region 130 is formed at both sides of the second trench 145.

The first trench 143 and the second trench 145 may have different depths.

The oxidation film 170 is formed on the first gate insulating layer 153 and the first gate electrode 163 at the first trench 143 and on the second gate insulating layer 155 and the second gate electrode 165 at the second trench 145.

The oxidation film 170, the first gate insulating layer 153, and the second gate insulating layer 155 may be made of silicon dioxide (SiO2).

The source electrode 180 is formed on the n+ region 120, the p-type region 130, and the oxidation film 170. That is, the bottom of the source electrode 180 is in contact with the top of the oxidation film 170, as shown in FIG. 2A, and as indicated by reference numeral '250' in FIG. 1, the top of the n+ region 120 and the top of the p-type region 130 are alternately in contact with each other. Accordingly, in the semiconductor device 50 according to an exemplary embodiment of the present inventive concept, since the source electrode 180 is in contact with both of the n+ region 120 and the p-type region 130, floating can be prevented by directly supplying an electrical signal.

The drain electrode 190 is formed on the other side of the n+ type silicon carbide substrate 100.

The first gate electrode 163, the second gate electrode 165, the source electrode 180, and the drain electrode 190 may be made of any one selected from gold (Au), silver (Ag), chromium (Cr), titanium (Ti), copper (Cu), aluminum (Al), tantalum (Ta), molybdenum (Mo), tungsten (W), nickel (Ni), palladium (Pd), and platinum (Pt), or alloys of them. The first gate electrode 163, the second gate electrode 165, the source electrode 180, and the drain electrode 190 may be made of polycrystalline silicon.

The semiconductor device 50 has a first channel 210 and a second channel 220 at the first trench 143 and the second trench 145, respectively. The first channel 210 and the second channel 220 are formed by accumulation of charge carriers at the first trench 143 and the second trench 145.

As described above, since the first channel 210 and the second channel 220 are formed by accumulation of charge carriers, the first channel 210 and the second channel 220 become deeper. Accordingly, the influence of the interface of the oxidation film 170 is reduced, so mobility of electrons is improved and resistance at the first channel 210 and the second channel 220 is reduced.

The first channel 210 is an accumulation layer channel formed at both sides of the first trench 143 in the n− type epitaxial layer 110, and the second channel 220 is an inversion layer channel formed in the p-type regions 130 at both sides of the second trench 145.

When a voltage is applied to the first gate electrode 163 and the second gate electrode 165, electrons and a current flow from the source electrode 180 to the drain electrode 190 through the first channel 210 and the second channel 220. That is, by applying a voltage to the first gate electrode 163 and the second gate electrode 165, charges create an accumulation layer channel and an inversion layer channel by being accumulated in the channel region, so the device can be turned on. The accumulation layer channel and the inversion layer channel may be independently or simultaneously turned on, depending on the manufacturing result.

Accordingly, since there are both an accumulation layer channel and an inversion layer channel in the semiconductor device 50 according to an exemplary embodiment of the present inventive concept, it is possible to provide low impedance.

A method of manufacturing a semiconductor device according to an exemplary embodiment of the present inventive concept will now be described with reference to FIGS. 3 to 8.

FIGS. 3 to 8 are views sequentially illustrating a method of manufacturing a semiconductor device according to an exemplary embodiment of the present inventive concept.

Figure 3:
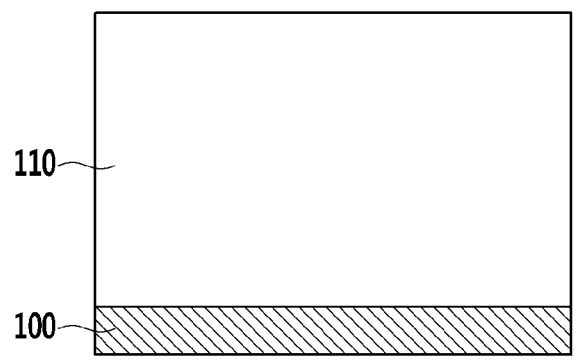
FIGS. 3 to 8 are views sequentially illustrating a method of manufacturing a semiconductor device according to an exemplary embodiment of the present inventive concept.

Referring to FIG. 3, the n− type epitaxial layer 110 is formed on a side of the n+ type silicon carbide substrate 100.

In other words, the n+ type silicon carbide substrate 100 is prepared to manufacture the semiconductor device 50. Thereafter, the n+ type silicon carbide substrate 100 can be cleaned. The reason for cleaning the n+ type silicon carbide substrate 100 is to remove foreign substances including organic substances and inorganic substances on the n+ type silicon carbide substrate 100.

The n− type epitaxial layer 110 is formed by epitaxial growth on a side of the n+ type silicon carbide substrate 100.

Figure 4:
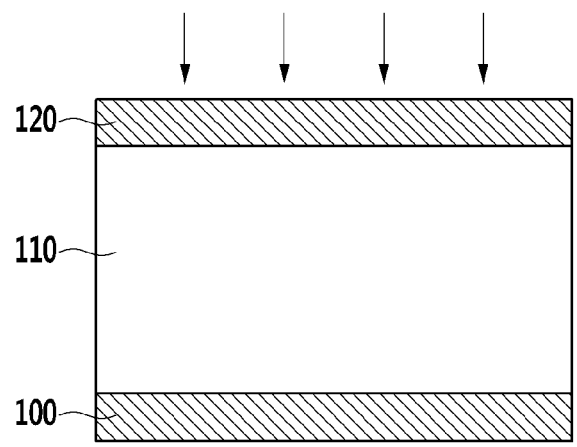

Referring to FIG. 4, the n+ region 120 is formed on the n− type epitaxial layer 110. That is, the n+ region 120 is formed on the n− type epitaxial layer 110 by injecting n+ ions such as phosphorus (P), arsenic (As), and antimony (Sb).

Figure 5:
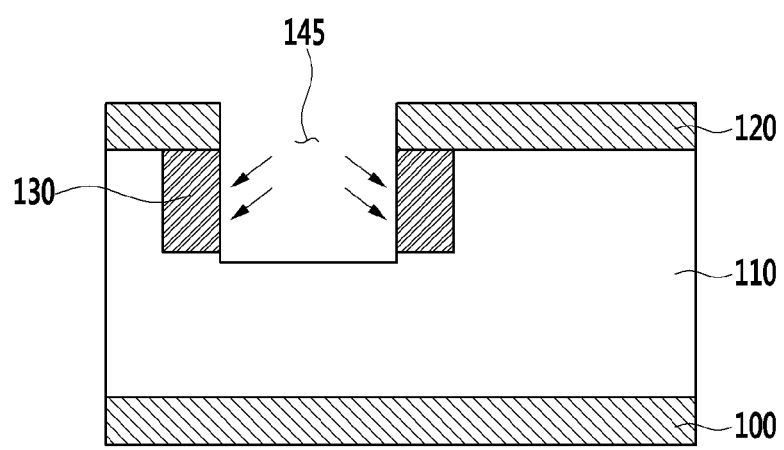

Referring to FIG. 5, the second trench 145 and the p-type region 130 are formed in the n− type epitaxial layer 110.

In other words, the second trench 145 is formed by etching the n− type epitaxial layer 110 and the n+ region 120. That is, the second trench 145 is formed through the n+ region 120 and in a portion of the n− type epitaxial layer 110. Thereafter, the p-type region 130 is formed under the n+ region 120 at both sides of the second trench 145 by injecting p-ions such as boron (B) and aluminum (Al). Further, when or after the second trench 145 is etched, a portion of the n+ region 120 is etched so that the p-type region 130 comes in contact with the source electrode 180.

Accordingly, a portion of the p-type region 130 can be in contact with the n+ region 120 and the other portion can be in contact with the source electrode 180.

Figure 6:
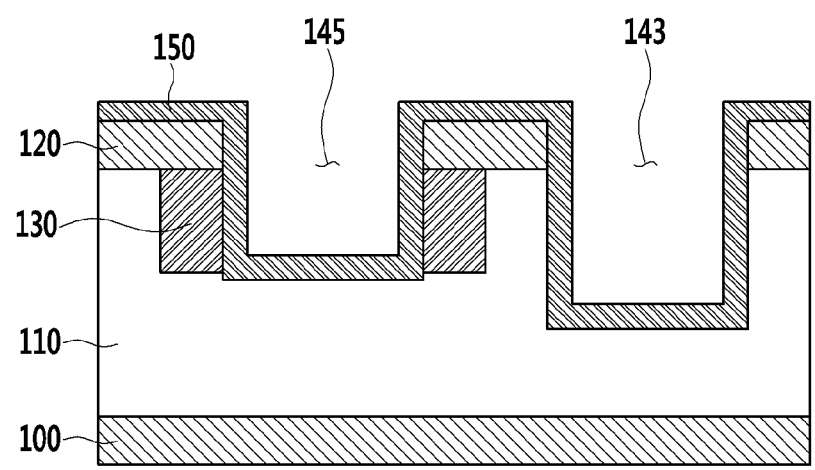

Referring to FIG. 6, the first trench 143 is formed in the n− type epitaxial layer 110, and a first insulating layer 150 is formed.

In other words, the first trench 143 is formed by etching the n− type epitaxial layer 110 and the n+ region 120. That is, the first trench 143 is formed through the n+ region 120 and in a portion of the n− type epitaxial layer 110. The first trench 143 may be formed deeper than the second trench 145. The first insulating layer 150 is formed to form the first gate insulating layer 153 and the second gate insulating layer 155 on the first trench 143, the second trench 145, and the n+ region 120.

Although it is exemplified to separately form the first trench 143 and the second trench 145 with reference to FIGS. 5 and 6, the present inventive concept is not limited thereto, and the first trench 143 and the second trench 145 may be simultaneously formed.

Figure 7:
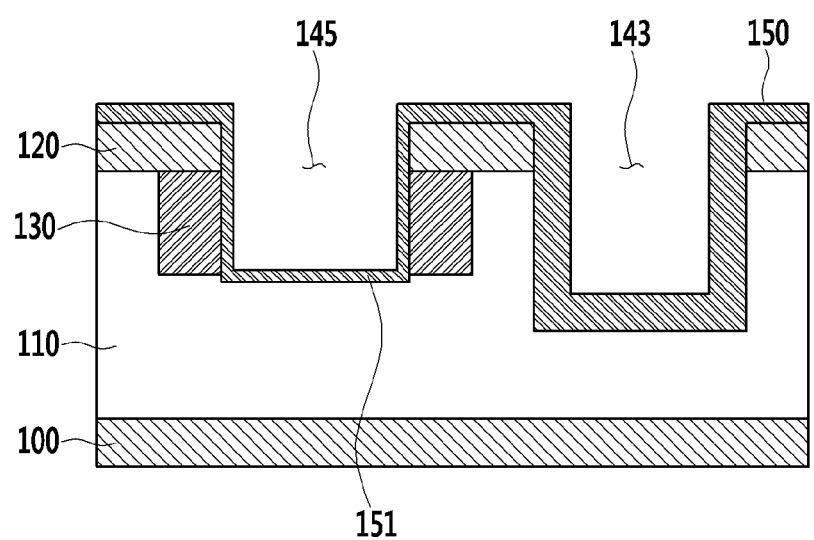

Referring to FIG. 7, a second insulating layer 151 is formed in the second trench 145.

In other words, the first insulating layer 150 formed in the second trench 145 is etched and the second insulating layer 151 is formed on the inner sides of the second trench 145 to be thinner than the first insulating layer 150 formed in the first trench 143.

Figure 8:
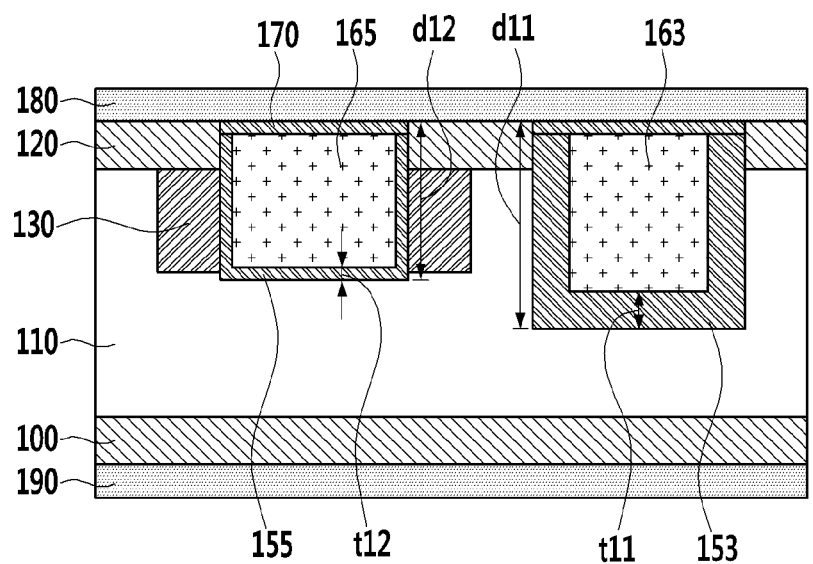

Referring to FIG. 8, the first gate electrode 163 and the second gate electrode 165 are formed in the first trench 143 and the second trench 145, respectively, and then the source electrode 180 and the drain electrode 190 are formed.

In detail, the first gate insulating layer 153 and the second gate insulating layer 155 are formed by etching the first insulating layer 150 and the second insulating layer 151 formed on the n+ region 120. The first gate electrode 163 and the second gate electrode 165 are formed in the first trench 143 and the second trench 145 where the first gate insulating layer 153 and the second gate insulating layer 155 are formed. The oxidation film 170 is made of silicon dioxide ($SiO_2$) on the first gate insulating layer 153, the first gate electrode 163, the second gate insulating layer 155, and the second gate electrode 165.

The source electrode 180 is formed on the oxidation film 170, the n+ region 120, and the p-type region 130, and the drain electrode 190 is formed on the other side of the n+ type silicon carbide substrate 100.

As shown in FIG. 8, in the semiconductor device 50 according to an exemplary embodiment of the present inventive concept, the thickness t11 of the first gate insulating layer 153 is larger than the thickness t12 of the second gate insulating layer 155, and the depth d11 of the first trench 143 is larger than the depth d12 of the second trench 145. Accordingly, the first gate electrode 163 may also be formed deeper than the second gate electrode 165.

In an off-state, an electric field concentrates on the edge of the lower end of a gate electrode, so the gate electrode may break. Accordingly, by making the first gate electrode 163 of a thick accumulation layer channel of the first gate insulating layer 153 deeper than the second gate electrode 165 of an inversion layer channel, it is possible to prevent a gate electrode from breaking even at a high voltage. Accordingly, the breakdown voltage increases.

Figure 9:
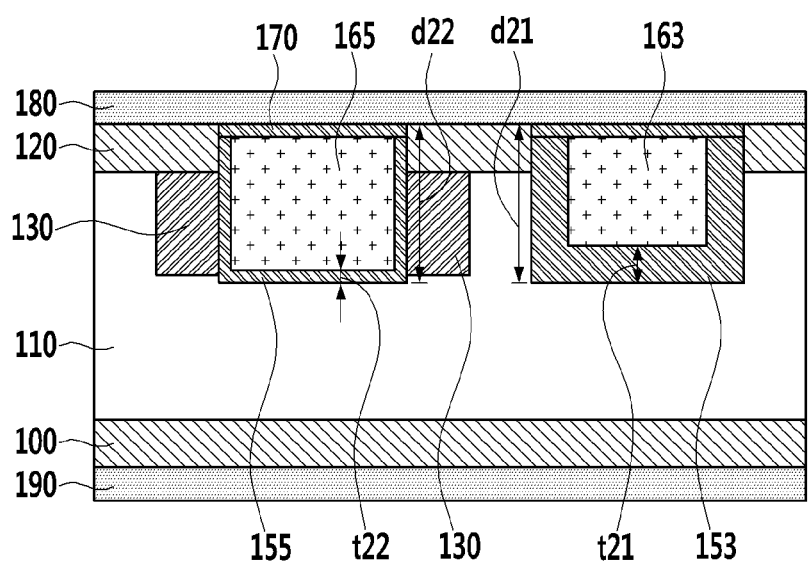
FIG. 9 is a cross-sectional view showing a semiconductor device according to another exemplary embodiment of the present inventive concept.

Further, as shown in FIG. 9, in a semiconductor device 50 according to another exemplary embodiment of the present inventive concept, the depth d21 of a first trench 143 is the same as the depth d22 of a second trench 145, but the thickness t21 of a first gate insulating layer 153 is larger than the thickness t22 of a second gate insulating layer 155.

When gate insulating layers have the same thickness, the threshold voltage of an accumulation layer channel is lower than that of an inversion layer channel. Accordingly, it is possible to increase a threshold voltage by making the first gate insulating layer 153 thicker than the second gate insulating layer 155 in order to prevent a current leakage in an on-state which may be caused in an accumulation layer channel.

Figure 10:
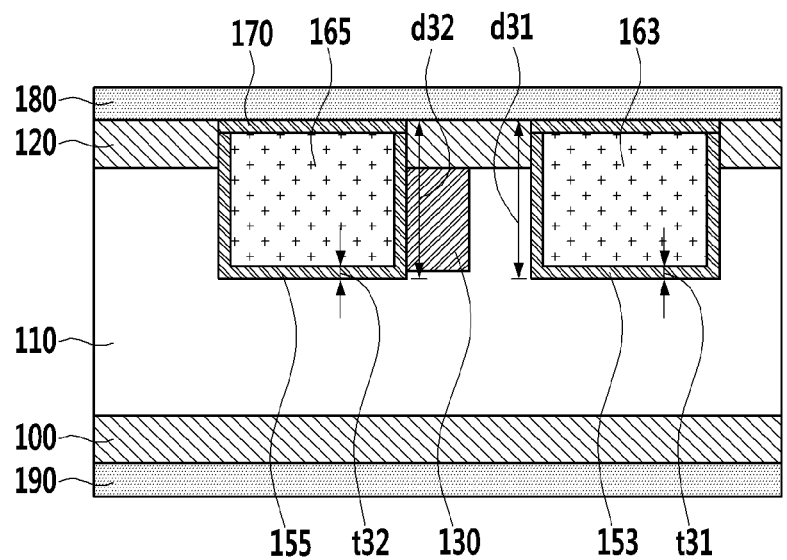
FIG. 10 is a cross-sectional view showing a semiconductor device according to another exemplary embodiment of the present inventive concept.

Further, as shown in FIG. 10, in a semiconductor device 50 according to another exemplary embodiment of the present inventive concept, the depth d31 of a first trench 143 is the same as the depth d32 of a second trench 145, and the thickness t31 of a first gate insulating layer 153 is also the same as the thickness t32 of a second gate insulating layer 155.

Characteristics of a semiconductor device according to an exemplary embodiment of the present inventive concept and a semiconductor device according to a comparative example are described with reference to FIGS. 11 and 12.

Figure 11:
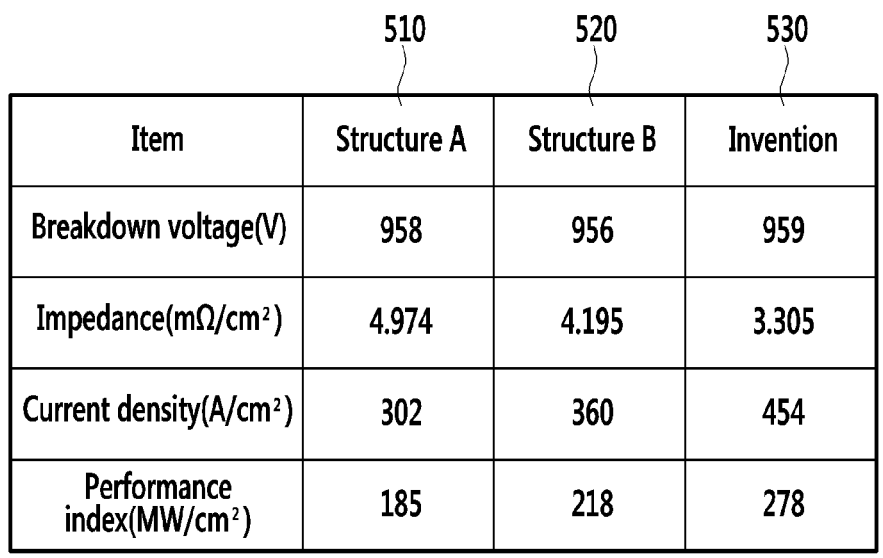
FIG. 11 is a table comparing a semiconductor device according to an exemplary embodiment of the present inventive concept with a semiconductor device according to a comparative exemplary embodiment.
Figure 12:
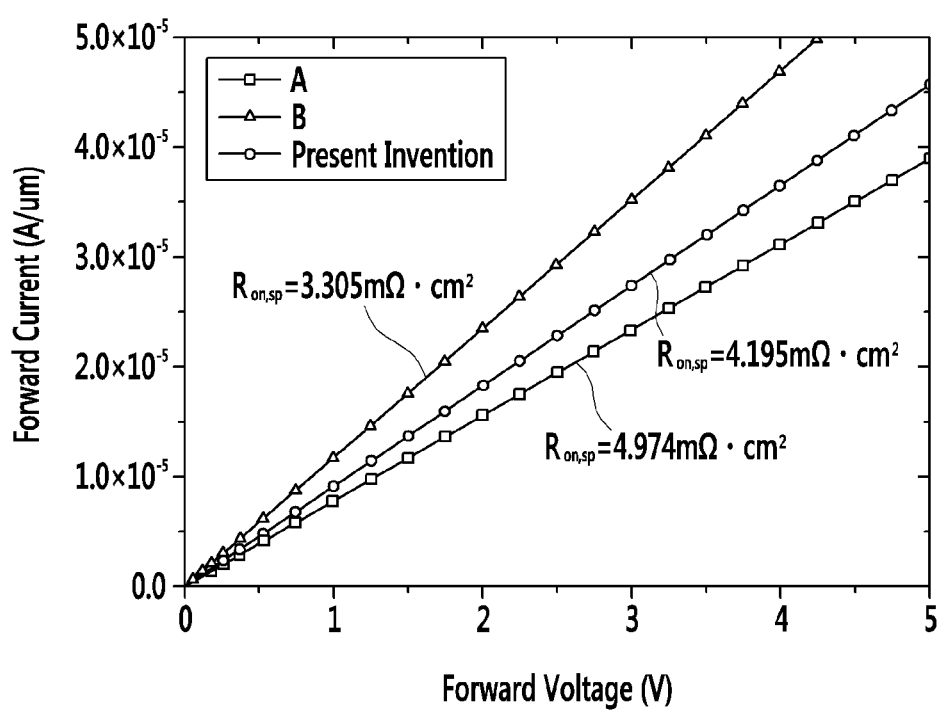
FIG. 12 is a graph comparing a semiconductor device according to an exemplary embodiment of the present inventive concept with a semiconductor device according to a comparative exemplary embodiment.

FIG. 11 is an exemplary view comparing a semiconductor device according to an exemplary embodiment of the present inventive concept with a semiconductor device according to a comparative exemplary embodiment, and FIG. 12 is a graph comparing a semiconductor device according to an exemplary embodiment of the present inventive concept with a semiconductor device according to a comparative exemplary embodiment.

The table shown in FIG. 11 shows a simulation result of characteristics of a semiconductor device according to an exemplary embodiment of the present inventive concept with a semiconductor device according to a comparative exemplary embodiment, and FIG. 12 is a graph showing impedance of a semiconductor device according to an exemplary embodiment of the present inventive concept with a semiconductor device according to a comparative exemplary embodiment.

In FIGS. 11 and 12, a structure A 510 is a semiconductor device including only an inverse layer channel, a structure B 520 is a semiconductor device including only an accumulation layer channel, and the present inventive concept 530 is a semiconductor device including an inversion layer channel and an accumulation channel according to an exemplary embodiment.

Referring to FIG. 11, in the semiconductor device of the structure A 510, a gate insulating layer may be formed relatively thin due to a sufficient threshold voltage. However, impedance is high, so it can be found that flow of electrons and a current is slow and current density is low.

The semiconductor device of the structure B 520 has low impedance, so it can be found that flow of electrons and a current is fast and current density is high.

As for the semiconductor device according to an exemplary embodiment 530 of the present inventive concept, it can be found that the impedance is lower than those of the semiconductor device of the structure A 510 and the semiconductor device of the structure B 520, and the current density is improved. That is, in the semiconductor device according to an exemplary embodiment of the present inventive concept, at the same level of breakdown voltage, the impedance is decreased by 34% relative to that of the semiconductor device of the structure A 510 and by 21% relative to that of the semiconductor device of the structure B 520. Further, in the semiconductor device according to an exemplary embodiment of the present inventive concept, at the same level of breakdown voltage, the current density is increased by 51% relative to that of the semiconductor device of the structure A 510 and to 26% relative to that of the semiconductor device of the structure B 520.

Accordingly, in the semiconductor device according to an exemplary embodiment of the present inventive concept, as the current density increases, the same current can be provided in a reduced area.

Further, it can be found that the performance index showing the performance of a semiconductor device is larger in the semiconductor device according to the exemplary embodiment 530 of the present inventive concept than in the semiconductor device of the structure A 510 and the semiconductor device of the structure B 520. That is, in the semiconductor device according to an exemplary embodiment of the present inventive concept, the performance index is increased by 51% relative to that of the semiconductor device of the structure A 510 and by 28% relative to that of the semiconductor device of the structure B 520.

Accordingly, it can be found that the semiconductor device including an accumulation layer channel and an inverse layer channel according to an exemplary embodiment of the present inventive concept has higher performance than those of the semiconductor device of the structure A 510 including only an inverse layer channel and the semiconductor device of the structure B 520 having only an accumulation layer channel. The performance index, which shows the performance of a semiconductor device, is usually obtained by dividing a square of a breakdown voltage by impedance.

While the present inventive concept has been described with reference to multiple exemplary embodiments, it is to be understood that the present inventive concept may be changed and modified in various ways without departing from the spirit and scope of the present inventive concept described in the following claims.

What is claimed is:

1. A semiconductor device comprising:
   an n− type epitaxial layer disposed on a first surface of an n+ type silicon carbide substrate;
   an n+ region disposed on the n− type epitaxial layer;
   first and second trenches disposed in the n− type epitaxial layer and the n+ region;
   first and second gate insulating layers disposed inside the first and second trenches, respectively;
   first and second gate electrodes disposed on the first and second gate insulating layers, respectively;
   a p-type region disposed on two sides of one of the first and second trenches;
   an oxidation film disposed on the first and second gate electrodes;
   a source electrode disposed on the n+ region and the oxidation film; and
   a drain electrode disposed on a second surface of the n+ type silicon carbide substrate,
   wherein a first channel is disposed on two sides of the first trench and a second channel is disposed on two sides of the second trench,
   wherein the first and second gate insulating layers have different thicknesses, and
   wherein the first and second gate electrodes have different depths.

2. The semiconductor device of claim 1, wherein the source electrode is in contact with the n+ region and the p-type region.

3. The semiconductor device of claim 1, wherein a bottom surface of the source electrode is alternately in contact with a top surface of the n+ region and a top surface of the p-type region.

4. The semiconductor device of claim 1, wherein the p-type region is disposed on two sides of the second trench, and the first channel is an accumulation-layer channel and the second channel is an inversion-layer channel.

5. The semiconductor device of claim 1, wherein the first and second trenches have different depths.

* * * * *